United States Patent
Nagara

(10) Patent No.: US 6,724,793 B2
(45) Date of Patent: Apr. 20, 2004

(54) LASER DIODE DRIVE CIRCUIT AND AMPLIFYING CIRCUIT FOR OPTICAL DISC RECORDING AND/OR REPRODUCING APPARATUS

(75) Inventor: Toru Nagara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/173,246

(22) Filed: Jun. 18, 2002

(65) Prior Publication Data

US 2003/0002552 A1 Jan. 2, 2003

(30) Foreign Application Priority Data

Jun. 19, 2001 (JP) ........................................ 2001-185251

(51) Int. Cl.[7] .............................................. H01S 3/00
(52) U.S. Cl. ............................. 372/38.02; 372/29.011; 369/53.2
(58) Field of Search ..................... 372/38.02, 38.03, 372/38.04, 29.011, 29.012; 369/53.2

(56) References Cited

U.S. PATENT DOCUMENTS

| | | | | |
|---|---|---|---|---|
| 4,523,089 A | * | 6/1985 | Maeda et al. ................ | 250/205 |
| 5,309,463 A | * | 5/1994 | Kasai ...................... | 372/38.02 |
| 5,805,559 A | * | 9/1998 | Murakami et al. .......... | 369/47.5 |
| 5,822,346 A | * | 10/1998 | Arai ........................ | 372/38.04 |
| 5,887,010 A | * | 3/1999 | Arai ........................ | 372/38.04 |
| 6,147,941 A | * | 11/2000 | Kumagai ................. | 369/44.26 |
| 6,154,474 A | * | 11/2000 | Yoshida .................... | 372/38.02 |
| 6,345,024 B2 | * | 2/2002 | Sugasawa et al. .......... | 369/53.2 |
| 6,483,787 B1 | * | 11/2002 | Sugasawa et al. ......... | 369/44.13 |
| 6,489,600 B1 | * | 12/2002 | Taguchi ...................... | 250/205 |
| 6,490,302 B1 | * | 12/2002 | Koishi et al. ............. | 372/38.02 |
| 6,539,036 B2 | * | 3/2003 | Lehr et al. .............. | 372/29.016 |
| 6,563,848 B1 | * | 5/2003 | Iwazaki .................... | 372/38.02 |
| 2002/0085600 A1 | * | 7/2002 | Jung ........................ | 372/38.02 |
| 2002/0136248 A1 | * | 9/2002 | Minneman .................... | 372/28 |
| 2003/0095579 A1 | * | 5/2003 | Ito et al. .................. | 372/38.01 |

* cited by examiner

Primary Examiner—Paul Ip
Assistant Examiner—Tuan Nguyen
(74) Attorney, Agent, or Firm—Oblon, Spivak, McClelland, Maier & Neustadt, P.C.

(57) ABSTRACT

A laser diode drive circuit for an optical disc recording and/or reproducing apparatus includes a plurality of laser diodes to output laser beams having different wavelengths, a switch circuit for selectively connecting a required laser diode from a plurality of laser diodes, a laser diode drive power supply circuit for driving the laser diode selectively connected by the switch circuit, a photodiode for detecting at least part of laser beams emitted from the laser diode to convert a detected part of laser beams into an electrical signal, a plurality of current-to-voltage conversion amplifiers connected to an output of the photodiode and whose conversion resistance values can be adjusted and having differently designed center conversion resistance values and an automatic power control circuit connected to outputs of the current-to-voltage conversion amplifiers to output a feedback signal to the laser diode drive power supply circuit. An amplifying circuit for such a laser diode drive power supply circuit, an optical disc recording and/or reproducing apparatus including such a laser diode drive circuit and a laser diode drive method for an optical disc recording and/or reproducing apparatus are also provided.

6 Claims, 4 Drawing Sheets

LASER DIODE DRIVE CIRCUIT AND AMPLIFYING CIRCUIT FOR OPTICAL DISC RECORDING AND/OR REPRODUCING APPARATUS

BACKGROUND OF THE INVENTION

1. Field of the Invention

The present invention generally relates to a laser diode drive circuit and an amplifying circuit for use in an optical disc recording and/or reproducing apparatus. More particularly, this invention relates to a current-to-voltage (I/V) converting circuit for use with a front monitor photodetector (FPD) and to a laser diode drive circuit using the above-mentioned current-to-voltage converting circuit.

2. Description of the Related Art

In recent years, a demand for an optical disc drive apparatus called "super disc drive" capable of reading and writing both a compact disc-recordable/rewritable (CD-R/RW) and a digital versatile disc (or digital video disc)-recordable/rewritable (DVD-R/RW) has been increasing on the market.

The optical disc drive apparatus of this kind generally uses a power monitor circuit to detect light intensity of laser beams. This power monitor circuit includes a monitor diode to receive several percents (this numerical value changes depending upon design of optical system) of laser beams emitted from a laser diode (LD). In that case, when the power monitor circuit includes only one laser diode LD, a change in quantity of incident light due to a fluctuation of a divergent angle of the laser diode LD or due to a fluctuation of a beam splitter is within a range of approximately ±6 dB.

When the change in the quantity of incident light falls within the above-mentioned range, it is possible to adjust the conversion resistance value of the current-to-voltage converting circuit of the front monitor photodetector circuit in response to dispersion of individual operational amplifiers without sacrificing the performance such as an operation band, offset, or the like.

However, let us consider now the electric power necessary for the two standards of the recordable/rewritable compact disc (CD-R/RW) and the recordable/rewritable digital versatile disc (DVD-R/RW). When speed at which data is to be recorded in the CD-R/RW is assumed to be 16 times as high as the normal speed, power (electric power) required by the laser diode LD becomes 160 mW expressed in the form of laser diode radiation electric power, and electric power required by the laser diode LD to record data in the DVD-R/RW becomes 70 mW expressed in the form of laser diode radiation electric power. Having compared two center values of the above-mentioned laser diode radiation electric power, it is to be understood that they have already differed from each other more than twice.

Further, having considered dispersion of individual laser diodes LD in addition to the difference of the laser diode radiation electric power, a range greater than ±12 dB is required as the range in which a parameter of a circuit is to be adjusted. Therefore, when it is intended to secure such a wide range for adjusting a parameter of a circuit from a circuit design standpoint, it becomes impossible to maintain the performance of the laser diode LD, such as the offset.

In order to realize the laser diode drive apparatus capable of reading and writing both the above-mentioned CD-R/RW and the above-mentioned DVD-R/RW, as shown in FIG. 1, there are required two high-output laser diodes LD1 and LD2 generating laser beams having wavelengths of 650 nm and 780 nm respectively. It is possible to realize functions necessary for the laser diode drive apparatus, even when an operational amplifier is configured in such a manner that the LD1 and LD2 are in separate optical systems. However, in this case it becomes unavoidable that the laser diode drive apparatus becomes large in size and becomes very expensive.

Accordingly, a demand for an operational amplifier having as many components other than the laser diode LD in common as possible is increasing.

FIG. 1 of the accompanying drawings is a schematic circuit diagram in block form, which shows a laser diode drive circuit for use in an optical disc recording and/or reproducing apparatus according to the related art. As shown in FIG. 1, this related-art laser diode drive circuit is comprised of a laser diode drive circuit, a power monitor circuit and an automatic power control (APC) circuit, whereby the two laser diodes LD1 and LD2 generating the laser beams having the wavelengths of 650 nm and 780 nm can be controlled respectively.

As shown in FIG. 1, this APC circuit has a configuration of using elements and parts in common in the circuit necessary for the two laser diodes LD1 and LD2, and only electric power is switched over to be set. Similarly, a laser diode drive power supply circuit LDD can be provided with two output terminals used to switch-over an output and other portion (power monitor circuit) of the laser diode drive circuit can be used in common.

The power monitor circuit for the disc writing laser diodes LD1 and LD2 is adapted to receive and monitor several percents (this numerical value changes depending upon design of the optical system) of emitted power of laser beams from the laser diode LD1 or LD2 by a monitor diode PD. In that case, when the power monitor circuit includes only one laser diode LD, a change in quantity of incident light due to a fluctuation of a divergent angle of the laser diode LD or a fluctuation of a beam splitter is within a range of approximately ±6 dB. When the change in the quantity of incident light falls within the above-mentioned range, it is possible to adjust the conversion resistance value of the current-to-voltage converting circuit of the front monitor photodetector (FDP) circuit in response to dispersion of individual operational amplifiers without sacrificing the performance such as an operation band, offset, or the like.

However, when electric power necessary for writing data in two standards of the CD-R/RW and the DVD-R/RW is considered, power (electric power) required by the laser diode LD necessary for the CD-R/RW becomes 160 mW and power required by the laser diode LD in the DVD-R/RW becomes 70 mW expressed in the form of laser diode radiation electric power at drive speed of the CD-R/RW being 16 times as high as the normal speed. Accordingly, two center values of the above-mentioned laser diode radiation electric power have already differed from each other more than twice. Further, having considered dispersion of individual laser diodes LD in addition to the fluctuations of the laser diode radiation electric power, a range greater than ±12 dB is required as the range in which a parameter of a circuit is to be adjusted. Thus, it becomes difficult to maintain the performance of the laser diode LD, such as the offset satisfactorily.

Furthermore, if the dynamic range of the optical disc recording and/or reproducing apparatus is doubly changed with respect to the CD-R/RW or the DVD-R/RW, then the available power margin is narrowed unavoidably. As a result, setting accuracy on the DVD-R/RW side where power should be set with high accuracy is doubly degraded, which is not preferable.

SUMMARY OF THE INVENTION

In view of the aforesaid aspect, it is an object of the present invention to provide a laser diode drive circuit for use in an optical disc recording and/or reproducing apparatus in which optimal conversion sensitivities for respective circuits can be maintained without sacrificing operation characteristics of the respective circuits.

It is another object of the present invention to provide an amplifying circuit for use with such a laser diode drive circuit of an optical disc recording and/or reproducing apparatus.

According to an aspect of the present invention, there is provided a laser diode drive circuit for an optical disc recording and/or reproducing apparatus which is comprised of a plurality of laser diodes outputting laser beams having different wavelengths, a switch circuit for selectively connecting a required laser diode from the plurality of laser diodes, a laser diode drive power supply circuit for driving the laser diode selectively connected by the switch circuit, a photodiode for detecting at least part of laser beams emitted from the laser diode and converting a detected part of laser beams into an electrical signal, a plurality of current-to-voltage conversion amplifiers connected to an output of the photodiode, being capable of adjusting conversion resistance values and having differently designed center conversion resistance values and an automatic power control circuit connected to outputs of the current-to-voltage conversion amplifiers to output a feedback signal to the laser diode drive power supply circuit.

According to other aspect of the present invention, there is provided an amplifying circuit comprised of a plurality of current-to-voltage conversion amplifiers connected in parallel being capable of adjusting conversion resistance values and having differently designed center conversion resistance values, and a change-over switch provided at an input side and output side of each current-to-voltage conversion amplifier, wherein one amplifier is selectively connected under switch-over control of the change-over switches.

According to a further aspect of the present invention, there is provided an optical disc recording and/or reproducing apparatus including a laser diode drive circuit. This laser diode drive circuit is comprised of a plurality of laser diodes for outputting laser beams having different wavelengths, a switch circuit for selectively connecting a required laser diode from a plurality of laser diodes, a laser diode drive power supply circuit for driving the laser diode selectively connected by the switch circuit, a photodiode for detecting at least part of laser beams emitted from the laser diode and converting a detected part of laser beams into an electrical signal, a plurality of current-to-voltage conversion amplifiers connected to an output of the photodiode, being capable of adjusting conversion resistance values and having differently designed center conversion resistance values, and an automatic power control circuit connected to outputs of the current-to-voltage conversion amplifiers to output a feedback signal to the laser diode drive power supply circuit.

In accordance with yet a further aspect of the present invention, there is provided a laser diode drive method for an optical disc recording and/or reproducing apparatus, comprising the steps of: selectively connecting a required laser diode from a plurality of laser diodes having different output wavelengths to a laser diode drive power supply circuit with a first switch circuit, driving the laser diode drive power supply circuit to allow the connected laser diode to emit laser beams, detecting at least part of laser beams emitted from the laser diode to convert the detected part of laser beams into an electrical signal by a photodiode, outputting the electrical signal to a corresponding current-to-voltage conversion amplifier of a plurality of current-to-voltage conversion amplifiers, being capable of adjusting conversion resistance values and having differently designed center conversion resistance values, wherein the electrical signal is current-to-voltage-converted and is amplified, selectively connecting an output of a required current-to-voltage conversion amplifier from the plurality of current-to-voltage conversion amplifiers to an automatic power control circuit with a second switch circuit, generating a feedback signal by the automatic power control circuit from the electrical signal which is current-to-voltage-converted and was amplified and outputting the feedback signal to the laser diode drive power supply circuit to effect a closed loop control.

DESCRIPTION OF THE PREFERRED EMBODIMENTS

A laser diode drive circuit and an amplifying circuit for use in an optical disc recording and/or reproducing apparatus according to the present invention will be described below with reference to the drawings.

Figure 1:
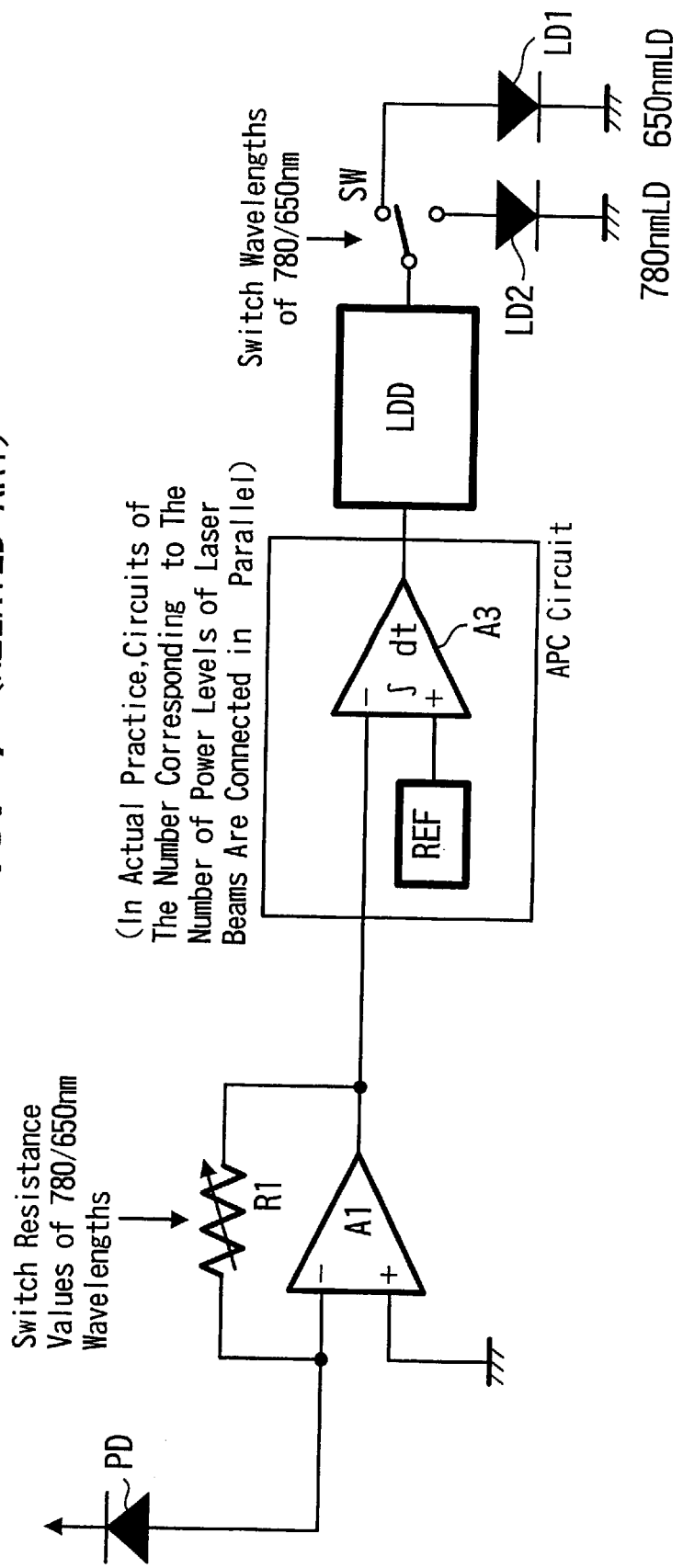
FIG. 1 is a block diagram showing a circuit arrangement of a laser diode drive apparatus for use in an optical disc recording and/or reproducing apparatus according to the related art.
Figure 2:
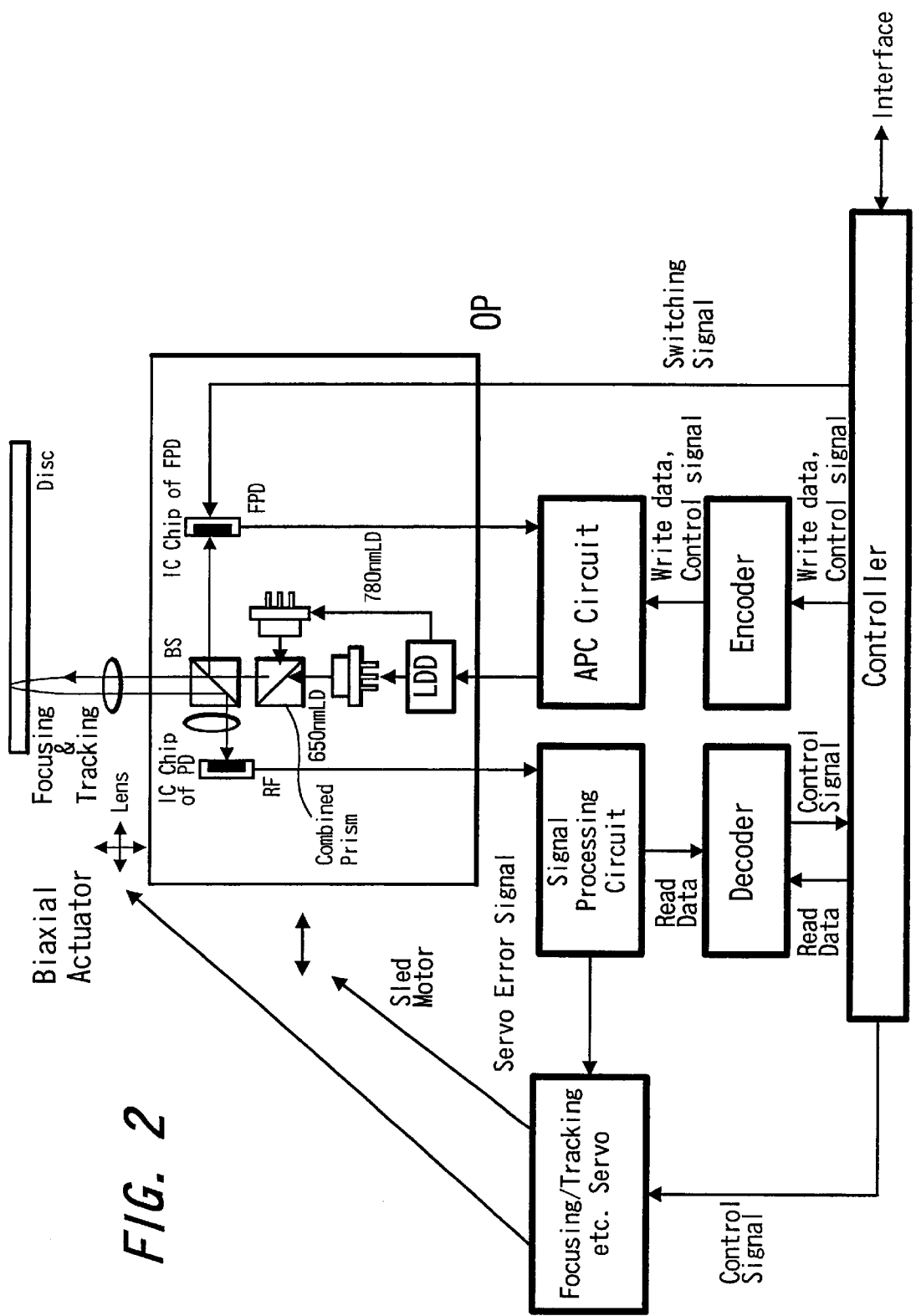
FIG. 2 is a block diagram showing an example of an optical disc recording and/or reproducing (write and/or read) apparatus according to the present invention.

FIG. 2 is a block diagram showing an example of an optical disc recording and/or reproducing (write and/or read) apparatus according to the present invention. According to this optical disc recording and/or reproducing apparatus, information may be recorded on the optical disc and/or reproduced from the optical disc, as briefly described below with reference to FIG. 2.

As shown in FIG. 2, when information is recorded on the optical disc in this optical disc recording and/or reproducing apparatus, a control signal and write data transmitted from an interface are supplied to an encoder. Data encoded by the encoder is supplied to an APC circuit to be controlled in power. Then, the data processed by the APC circuit is supplied to an optical pickup (OP), in which the processed data is optically modulated and is then properly focused on a rotating optical disc, thereby being recorded on the optical disc.

Also, when information is reproduced from the optical disc in this optical disc recording and/or reproducing apparatus, information recorded on the optical disc is reflected in the reflected light that has been irradiated on the optical disc by a laser diode (LD). This reflected light is supplied to a photodetector (PDIC) which photoelectrically converts the reflected light to provide an RF signal. This RF signal is supplied to a signal processing circuit to extract a servo signal and a read data signal. The read data signal is supplied to a decoder to be decoded and the decoded read data signal is transmitted to the outside through an interface under control of a controller.

In this optical disc recording and/or reproducing apparatus, the laser diode (LD) in the optical pickup (OP) is switched-over depending upon the type of optical disc, and light emitted from the working laser diode (LD) is irradiated on the optical disc through a combined prism.

Part of light emitted from the laser diode (LD) is fed through a semiconductor chip (FPD-IC) of a front monitor photodiode (FPD) back to the APC circuit, where it is used for a variety of control operations. These control operations will be described below in association with a laser diode drive circuit (LDD) with reference to FIG. 3 in which case the FPD-IC (shown in FIG. 2) is represented as a photodetector PD (photodetectors PD1, PD2).

Figure 3:
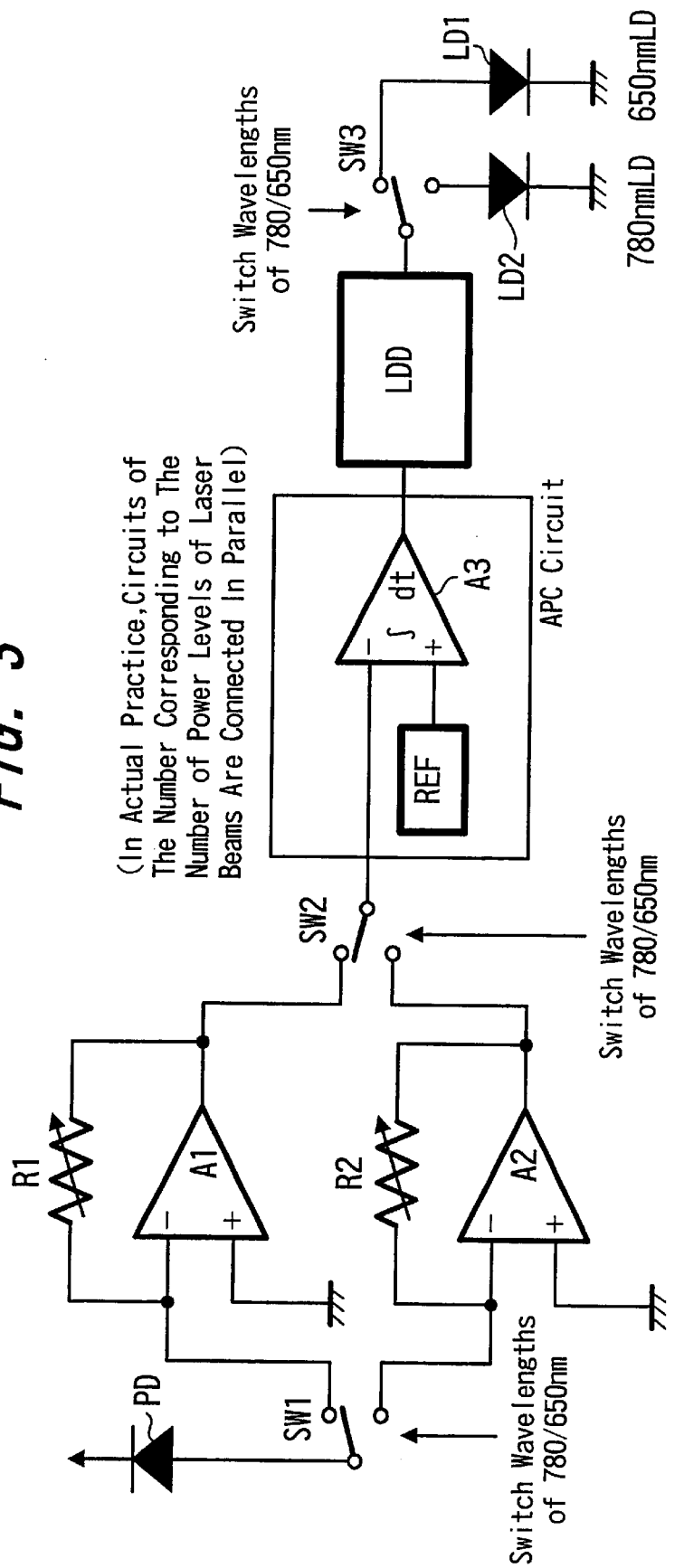
FIG. 3 is a block diagram showing a circuit arrangement of a laser diode drive apparatus for use in an optical disc recording and/or reproducing apparatus according to an embodiment of the present invention.

FIG. 3 is a block diagram showing a laser diode drive circuit for use in an optical disc recording and/or reproducing (write and/or read) apparatus according to an embodiment of the present invention.

As shown in FIG. 3, there are provided laser diodes LD1 and LD2 adapted to generate laser beams for recording and/or reproducing. These laser diodes LD1 and LD2 are driven by power supplied from a laser diode drive power source circuit LDD. An output from this laser diode drive circuit LDD is switched over by a switch SW3 and supplied to either the laser diode LD1 or LD2.

Let it now be assumed that the switch SW3 is connected to the contact illustrated in FIG. 3. The laser diode LD1 is being driven and data is being written in the disc with laser beams emitted from the laser diode. Then, part of the emitted laser beams is received by a photodiode PD and that is introduced into an operational amplifier A1 through the contact of a switch SW1 illustrated in FIG. 3, where an output current of the photodiode PD is converted into a voltage. An output from the operational amplifier A1 is supplied through the illustrated contact of a switch SW2 to an inverting input terminal of a comparing operational amplifier A3 in an APC (auto power control) circuit.

A reference voltage source REF is connected to a non-inverting input terminal of the comparing operational amplifier A3, and the comparing operational amplifier A3 compares the signal supplied to the inverting input terminal with the reference voltage supplied to the non-inverting input terminal. A detected error signal is supplied from the output terminal of the comparing operational amplifier A3 to the laser diode drive power supply circuit LDD. Although there is illustrated only one reference voltage source REF in FIG. 3, in actual practice, there are provided different reference voltage values the number of which corresponds to the number of power levels of laser beams.

Part of laser beams emitted from the laser diodes LD1, LD2 is obtained by a suitable means and led to the above-mentioned detection photodiode PD. However this process is not directly related to the present invention and therefore need not be described in detail.

The laser diode LD1 is controlled by a signal received at the photodiode PD and then supplied through the switch SW1, the amplifier A1, the switch SW2 and the comparing operational amplifier A3 back to the laser diode drive power supply circuit LDD in such a manner that the laser diode drive power supply circuit LDD may be driven at constant output power. Specifically, if it is determined that there is no error signal by comparing the voltage of the feedback signal and the reference voltage in the comparing operational amplifier A3, the output of the laser diode drive power supply circuit LDD is not changed at all.

As intensity of light emitted from the laser diode LD1 increases, the intensity of the signal detected by the photodiode PD also increases so that the intensity of the signal fed back to the comparing operational amplifier A3 also increases. Therefore, a negative feedback signal is supplied from the comparing operational amplifier A3 to the laser diode drive power supply circuit LDD in order to decrease intensity of the output of the laser diode LD1 by the laser diode drive power supply circuit LDD. Also, when intensity of light emitted from the laser diode LD1 decreases, intensity of the output from the laser diode LD1 is increased by the laser diode drive power supply circuit LDD.

While the case where the laser diode LD1 is controlled has been described so far, the present invention is not limited thereto and the laser diode LD2 can be controlled similarly as described above. Specifically, the contact positions of the switches SW1, SW2 and SW3 may be changed-over to the opposite sides and control operations similar to those of the above-mentioned case may be carried out.

Although only one APC circuit is illustrated in the circuit arrangement in FIG. 3 in order to make the present invention clearly understandable, in actual practice, there are provided a plurality of APC circuits, the number of which corresponds to the number of power levels of laser beams. These APC circuits are connected in parallel, and upon use, a required APC circuit is connected to the drive circuit.

Although output voltages of the current-to-voltage conversion amplifiers A1, A2 connected to the output of the photodiode PD can be adjusted by variable resistors R1, R2, the ranges adjusted by these variable resistors R1, R2 are limited.

When the laser diodes LD1, LD2 and other circuit elements are used and driven by change-over switches, the operation range is unavoidably widened, and hence it becomes difficult for only one amplifier to control all the driving of these circuit elements. Moreover, when one amplifier is used in common for all the driving of these circuit elements, the operation characteristics of the current-to-voltage conversion amplifier cannot be maintained satisfactorily.

In order to solve the above-mentioned problem, in the laser diode drive circuit according to an embodiment of the present invention as shown in FIG. 3, there are prepared a plurality of current-to-voltage conversion amplifiers. When a laser diode having a different wavelength is in use, a proper amplifier can be selected from a plurality of amplifiers prepared as described above and then used, which will be described below more in detail.

In the circuit shown in FIG. 3, during the period in which the laser diode LD1 is being operated, the output of the photodiode PD is connected to the contact of the amplifier A1 side by the switch SW1 and then the output voltage of the amplifier A1 is inputted to the APC circuit through the switch SW2, in which the voltage is compared with the reference voltage REF and a difference voltage is fed back to the laser diode drive power supply circuit LDD.

On the other hand, when the laser diode LD2 is being operated, the output of the photodiode PD is connected to the contact of the amplifier A2 side by the switch SW1 and then the output voltage of the amplifier A2 is inputted through the switch SW2 to the APC circuit, in which the voltage is compared with the reference voltage REF and a difference voltage is fed back to the laser diode drive power supply circuit LDD.

In the circuit shown in FIG. 3, if the current-to-voltage conversion amplifiers A1, A2 and the switches SW1, SW2 are fabricated as one circuit which is connected to the laser diode drive circuit as required, the design of the circuit can be made easy.

Figure 4:
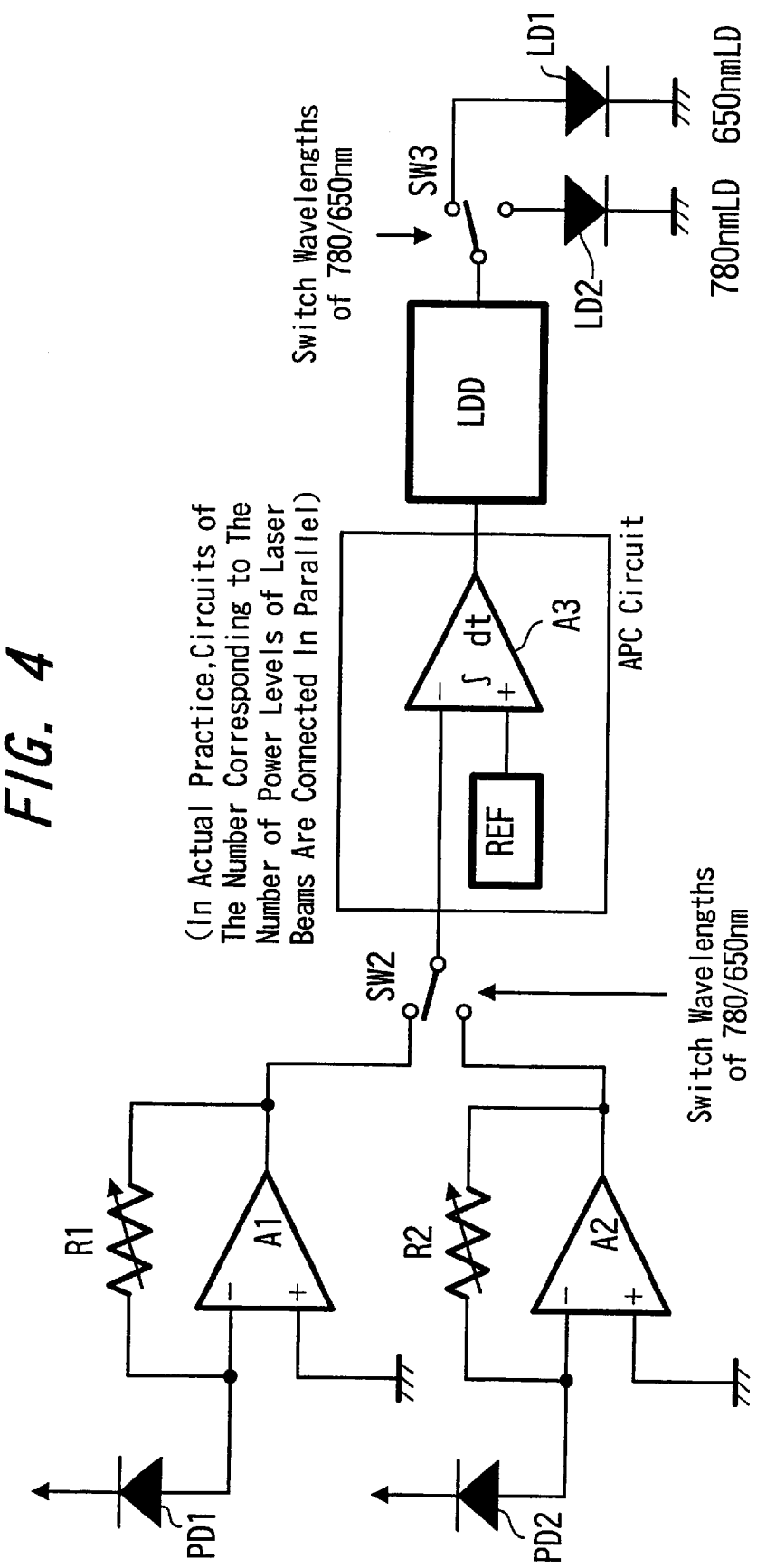
FIG. 4 is a block diagram showing a circuit arrangement of a laser diode drive apparatus for use in an optical disc recording and/or reproducing apparatus according to another embodiment of the present invention.

While the laser diode drive circuit that has been described so far with reference to FIG. 3 uses only one power monitor photodiode PD, the present invention is not limited thereto, and the following variant is also possible. That is, in the second embodiment of the present invention shown in FIG. 4, the above-mentioned power monitor photodiode is comprised of a plurality of photodiodes PD1, PD2. Current-to-voltage conversion amplifiers A1, A2 are connected to the outputs of the respective photodiodes PD1, PD2 and are selectively connected to the above-mentioned automatic power control (APC) circuit by the switch circuit SW2. In FIG. 4, elements and part identical to those of FIG. 3 are denoted by identical reference numerals and therefore need not be described.

According to the laser diode drive circuit for the optical disc recording and/or reproducing apparatus of the present invention, since there are provided a plurality of adjustable operational amplifiers, wherein an optimum operational amplifier is inserted into the circuit by operating switches, there can be carried out the optimum current-to-voltage (I/V) conversion sensitivity adjustment with respect to the respective laser diodes LD comprising the light source.

Further, according to the laser diode drive circuit for the optical disc recording and/or reproducing apparatus of the present invention, since there are prepared a plurality of current-to-voltage conversion amplifiers having different operation characteristics, the dynamic range of the circuit can be used efficiently by selecting a required-current-to-voltage conversion amplifier by the change-over switches.

Furthermore, according to the laser diode drive circuit for the optical disc recording and/or reproducing apparatus of the present invention, since there are prepared a plurality of current-to-voltage conversion amplifiers having different operation characteristics and which can be changed-over by the switches upon use, the operation band, the offset and the noise characteristic can be adjusted excellently for each laser diode LD.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A laser diode drive circuit for an optical disc recording and/or reproducing apparatus, comprising:
   a plurality of laser diodes for outputting laser beams having different wavelengths and different power output levels;
   a laser diode drive power supply circuit;
   a first switch circuit for selectively connecting a required laser diode from said plurality of laser diodes to said laser diode drive power supply circuit;
   a photodiode for detecting at least part of laser beams emitted from said laser diode to convert a detected part of laser beams into an electrical signal;
   a plurality of current-to-voltage conversion amplifiers connected to an output of said photodiode, being configured to adjust conversion resistance values and having different center conversion resistance values corresponding to respective said different power output levels of said plurality of laser diodes; and
   an automatic power control circuit connected by way of a second switch to outputs of said current-to-voltage conversion amplifiers to output a feedback signal to said laser diode drive power supply circuit.

2. The laser diode drive circuit for an optical disc recording and/or reproducing apparatus according to claim 1, wherein
   said photodiode comprises a single diode, and
   a plurality of switch circuits configured to selectively connect a required current-to-voltage conversion amplifier provided both between an output of said photodiode and inputs of said plurality of current-to-voltage conversion amplifiers, and between outputs of said plurality of current-to-voltage conversion amplifiers and an input of said automatic power control circuit.

3. The laser diode drive circuit for an optical disc recording and/or reproducing apparatus according to claim 1, wherein
   said photodiode comprises a plurality of diodes,
   outputs of said respective diodes are connected to inputs of corresponding current-to-voltage conversion amplifiers of said plurality of current-to-voltage conversion amplifiers respectively, and
   a plurality of switch circuits for selectively connecting required current-to-voltage conversion amplifiers are provided between outputs of said plurality of current-to-voltage conversion amplifiers and an input of said automatic power control circuit.

4. An amplifying circuit comprising:
   a plurality of current-to-voltage conversion amplifiers connected in parallel, being configured to adjust conversion resistance values and having different center conversion resistance values corresponding to respective different power output levels of a plurality of operably linked laser diodes; and
   a plurality of change-over switches provided at the input sides and output sides of said plurality of current-to-voltage conversion amplifiers, whereby one amplifier is selectively connected under change-over control of said plurality of change-over switches.

5. An optical disc recording and/or reproducing apparatus including a laser diode drive circuit, said laser diode drive circuit comprising:
   a plurality of laser diodes for outputting laser beams having different wavelengths and different power output levels;
   a laser diode drive power supply circuit;
   a switch circuit for selectively connecting a required laser diode from said plurality of laser diodes to said laser diode drive power supply circuit;
   a photodiode for detecting at least part of laser beams emitted from said laser diode to convert a detected part of laser beams into an electrical signal;
   a plurality of current-to-voltage conversion amplifiers connected to an output of said photodiode, being configured to adjust conversion resistance values and having different center conversion resistance values corresponding to respective said different power output levels of said plurality of laser diodes; and an automatic power control circuit connected by way of a second switch to outputs of said current-to-voltage conversion amplifiers to output a feedback signal to said laser diode drive power supply circuit.

6. A laser diode drive method for an optical disc recording and/or reproducing apparatus, comprising:

selectively connecting a laser diode from a plurality of laser diodes having different output wavelengths and different power output levels to a laser diode drive power supply circuit with a first switch circuit;

driving said laser diode drive power supply circuit to allow the connected laser diode to emit laser beams;

detecting at least part of laser beams emitted from said laser diode to convert said detected part of laser beams into an electrical signal by a photodiode;

outputting said electrical signal to a corresponding current-to-voltage conversion amplifier of a plurality of current-to-voltage conversion amplifiers, the corresponding amplifier being configured to adjust conversion resistance values and having different center conversion resistance values corresponding to respective said different power output levels of said plurality of laser diodes, wherein said electrical signal is current-to-voltage-converted and is amplified;

selectively connecting an output of a required current-to-voltage conversion amplifier from said plurality of current-to-voltage conversion amplifiers to an automatic power control circuit with a second switch circuit;

generating a feedback signal from said electrical signal, which has been current-to-voltage-converted and amplified, by said automatic power control circuit; and outputting said feedback signal to said laser diode drive power supply circuit to effect a closed loop control.

* * * * *